(12) United States Patent
Chen et al.

(10) Patent No.: US 6,556,061 B1
(45) Date of Patent: Apr. 29, 2003

(54) LEVEL SHIFTER WITH ZERO THRESHOLD DEVICE FOR ULTRA-DEEP SUBMICRON CMOS DESIGNS

(75) Inventors: Chung-Hui Chen, Hsin-Chu (TW); Wen-Tai Wang, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 55 days.

(21) Appl. No.: 09/784,823

(22) Filed: Feb. 20, 2001

(51) Int. Cl.[7] .......................................... H03K 19/0175
(52) U.S. Cl. ....................................... 327/333; 327/437
(58) Field of Search ................................. 327/333, 306, 327/437, 427; 326/62, 81, 68

(56) References Cited

U.S. PATENT DOCUMENTS

| | | | |
|---|---|---|---|
| 5,153,451 A | 10/1992 | Yamamura et al. | 307/279 |
| 5,450,357 A | 9/1995 | Coffman | 365/189.11 |
| 5,539,334 A | 7/1996 | Clapp, III et al. | 326/68 |
| 5,698,993 A | 12/1997 | Chow | 326/81 |
| 5,705,946 A | 1/1998 | Yin | 327/333 |
| 5,729,155 A | 3/1998 | Kobatake | 326/68 |
| 5,821,800 A | 10/1998 | Le et al. | 327/333 |
| 5,841,694 A * | 11/1998 | Wong | 365/185.05 |
| 5,892,371 A | 4/1999 | Maley | 326/81 |
| 5,917,339 A | 6/1999 | Kim | 326/68 |
| 5,963,054 A | 10/1999 | Cochran et al. | 326/68 |
| 5,963,061 A | 10/1999 | Briner | 327/55 |
| 6,002,290 A * | 12/1999 | Avery et al. | 327/333 |
| 6,043,698 A | 3/2000 | Hill | 327/333 |
| 6,043,699 A | 3/2000 | Shimizu | 327/333 |
| 6,096,610 A * | 8/2000 | Alavi et al. | 438/286 |
| 6,222,384 B1 * | 4/2001 | Kim | 326/68 |

* cited by examiner

Primary Examiner—Dinh T. Le
(74) Attorney, Agent, or Firm—George O. Saile; Stephen B. Ackerman; Douglas R. Schnabel

(57) ABSTRACT

A new level shifting circuit, using a zero threshold voltage device, is described. An input swings between a low supply and ground. An output swings between a high supply and ground. An inverter has input connected to the input of the level shifting circuit and output forming an inverted level shifting input. A first NMOS transistor has the gate connected to the level shifting input and the source connected to ground. A first zero threshold NMOS transistor has the gate connected to a low bias voltage and the source connected to the first NMOS transistor drain. A first PMOS transistor has the gate connected to the level shifting output, the source connected to the high supply, and the drain connected to the first zero threshold NMOS transistor drain. A second NMOS transistor has the gate connected to the inverted level shifting input and the source connected to ground. A second zero threshold NMOS transistor has the gate connected to the low bias voltage, the source connected to the second NMOS transistor drain, and the drain connected to the level shifting output. A second PMOS transistor has the gate connected to the first zero threshold NMOS transistor drain, the source connected to the high supply, and the drain connected to the level shifting output.

20 Claims, 2 Drawing Sheets

LEVEL SHIFTER WITH ZERO THRESHOLD DEVICE FOR ULTRA-DEEP SUBMICRON CMOS DESIGNS

BACKGROUND OF THE INVENTION

1. Field of the Invention

The invention relates to digital integrated circuits, and more particularly, to a circuit that allows a digital signal to be level shifted from a low voltage supply to a high voltage supply.

2. Description of the Prior Art

Ultra deep submicron CMOS technologies are used to create digital integrated circuits with very high transistor densities and very high switching speeds. These submicron CMOS transistors have very thin gate oxide and very low threshold voltages. To facilitate use of ultra deep submicron CMOS processes, the supply voltage for the high density logic core must be lowered to improve device reliability. Supply voltages of between about 2.5 Volts and 3.3 Volts, which have been typical for prior art CMOS logic devices, have to be reduced to a low voltage regime of, for example, between about 0.9 Volts and 2.5 Volts.

While the supply voltage of the core logic section is being reduced, the supply voltage for the input/output section of the integrated circuit must be kept at a higher level to assure adequate signal-to-noise ratio and compatibility with other devices. Where digital signals in the low voltage core must be transmitted off the integrated circuit, signal level shifting is therefore necessary. A level shifting circuit is used to increase the upper voltage swing of the low voltage signal, from a low voltage to a high voltage.

Referring now to FIG. 1, a prior art level shifting circuit is shown. This level shifting circuit uses four types of transistors. Low voltage NMOS transistors 10 and low voltage PMOS transistors 14 are used in the low supply voltage VCCL 34 section. High voltage NMOS transistors 18 and high voltage PMOS transistors 22 are used in the high supply voltage VCCH section. The low voltage transistors 10 and 14 have a thinner gate oxide than the high voltage transistors 18 and 22. In addition, the low voltage transistors 10 and 14 have a low threshold voltage of between about 0.2 Volts and 0.35 Volts for NMOS 10 and between about −0.2 Volts and −0.35 Volts for PMOS 14. High voltage devices have a threshold voltage of between about 0.4 Volts and 0.7 Volts for NMOS 18 and between about −0.4 Volts and −0.7 Volts for PMOS 22.

The prior art level shifting circuit uses an inverter made up of transistors MN1 46 and MP1 50 and a differential pair made up of transistors MN2 54, MN3 58, MP2 62, and MP3 66. Generally, the low voltage supply VCCL 34 is biased at between about 0.9 Volts and 2.5 Volts. The high voltage supply VCCH 42 is biased at between about 3 Volts and 5 Volts. The purpose of the level shifting circuit is to convert the input signal IN 26 from a swing of between 0 Volts and VCCL 34 to a swing of between 0 Volts and VCCH 42 at the output node OUT 30.

The prior art level shifting circuit exhibits dc voltage and transistor switching characteristics according to Table 1 below:

TABLE 1

| IN   | INB  | OUT  | OUTB | MN1 | MP1 | MN2 | MN3 | MP2 | MP3 |
|------|------|------|------|-----|-----|-----|-----|-----|-----|
| VSS  | VCCL | VSS  | VCCH | OFF | ON  | OFF | ON  | ON  | OFF |
| VCCL | VSS  | VCCH | VSS  | ON  | OFF | ON  | OFF | OFF | ON  |

Note that the prior art level shifting circuit exhibits no dc static current consumption. Since the input signal IN 26 only connects to the gates of transistors MN1 46, MP1 50, and MN2 54, there is no dc input leakage path. Only one of the inverter pair MN1 46 and MP1 50 is ON in either state. Therefore, there exists no static current path from VCCL 34 to VSS 38. Finally, since only one of the pair MN2 54 and MP3 66 or the pair MN3 58 and MP2 62 are ON at any given time, there exists no static current path between VCCH and VSS.

Note also that the high supply voltage VCCH is only applied to the thick oxide devices MN2 54, MN3 58, MP2 62 and MP3 66. Therefore, reliability concerns for the thin oxide devices are eliminated.

To illustrate the ac performance of the prior art level shifting circuit, consider the case of the input signal IN 26 switching from VSS to VCCL. First, transistor MN2 54 turns ON. At this point, transistor MP2 62 remains ON. Therefore, while MN2 54 is driving node OUTB 28 to VSS, MP2 62 is concurrently driving node BUTB 28 to VCCL. After transistor MP1 50 turns OFF, the inverter output INB 27 transitions to VSS. Transistor MN3 58 is therefore turned OFF. Finally, once the voltage at node OUTB 28 is discharged, transistor MP3 66 is turned ON. MP3 66 drives the output node OUT 30 to VCCH and turns OFF MP2 62.

An analysis of the ac operation of the prior art level shifting circuit reveals a serious switching delay when the design is used in an ultra-deep submicron process. In such processes, the VCCL 34 voltage is very small to facilitate the usage of very small devices with very thin gate oxides, shallow junctions, and shrinking threshold voltages. However, the key input transistors of the circuit, MN2 54 and MN3 58, still have large voltage thresholds. Therefore, the $I_{dsat}$ of these thick gate NMOS devices MN2 54 and MN3 58, at the relatively small gate drive of VCCL, is also small. If, as in the example case, MN2 54 must drive node OUTB 28 against MP2 62, then the reduced $I_{dsat}$ of MN2 54 will cause the OUTB signal transition to take a long time.

In addition, since OUTB 28 initially remains at or near VCCH 42, transistor MP3 66 is OFF. At the same time, transistor MN3 58 is in the off-state once INB 27 discharges to VSS. In this condition, the output node OUT 30 is floating. The voltage level of OUT 30 will depend on the load and the reverse saturation current of the MP3 66 drain-to-N Well and the MN3 58 drain-to-P Well junction diodes during the transition time prior to MN2 54 discharging OUTB 28 to VSS.

Finally, the $I_{dsat}$ of MN2 54 and of MN3 58 may be made larger than the $I_{dsat}$ of MP2 62 and of MP3 66 by making MN2 and MN3 sufficiently large to overcome the relatively small gate drive. However, this adds substantially to the area required for the level shifting circuit. In addition, the parasitic capacitance from the gate of MP3 66 and the drain junction of MP2 62 must be discharged by MN2 54 during a transition.

Several prior art inventions describe circuits for level shifting and handling higher voltage supplies in low voltage CMOS applications. U.S. Pat. No. 6,043,699 to Shimizu describes level shifting circuits with higher speed or with extended operating ranges. U.S. Pat. No. 6,043,698 to Hill teaches a level shifting circuit using a latch and resistors in the interface section. U.S. Pat. No. 5,892,371 to Maley discloses a level shifting circuit configured to protect MOS transistors from gate oxide failure by limiting the voltage across any one transistor. U.S. Pat. No. 5,729,155 to Kobatake describes a level shifting circuit where an NMOS transistor and a PMOS transistor are connected in series between the top rail PMOS transistor and the bottom rail NMOS transistor. The additional transistors are biased to fixed voltage references to insure that each device is ON. The presence of the transistor pair reduces the voltage stress on each device in the stack. U.S. Pat. No. 5,539,334 to Clapp, III et al discloses a circuit, comprising low voltage components, that can be used with a high voltage supply. The level shifting circuit embodiment may accommodate multiple power supplies. However, Clapp, III et al, has serious drawbacks for submicron application because diode 56 (FIG. 3) will turn on when VCC1 is higher than the output voltage. Therefore, the output voltage cannot be pulled all the way down to VSS and the circuit will leak dc current.

U.S. Pat. No. 5,821,800 to Le et al teaches a level shifting circuit capable of high voltage operation using low voltage CMOS devices. One or more complementary NMOS and PMOS pairs are used between the top rail PMOS and the bottom rail NMOS transistors. The complementary devices are not self-biased. U.S. Pat. No. 5,153,451 to Yamamura et al describes a level shifting circuit that has a fail-safe mode. The output state is guaranteed high or guaranteed low if the input signal voltage falls below a predetermined level. U.S. Pat. No. 5,698,993 to Chow discloses a level shifting circuit where an NMOS transistor is added to each side of the differential pair to improve switching speed and symmetry. The gates of the added NMOS devices are biased to a constant low voltage supply. U.S. Pat. No. 5,705,946 to Yin teaches a two-stage level shifter using a voltage divider input. U.S. Pat. No. 5,917,339 to Kim describes a mixed voltage input buffer. U.S. Pat. No. 5,963,061 to Briner discloses a level shifting circuit using complementary NMOS and PMOS transistor pairs stacked between the rail devices as guard devices to limit high voltage exposure. The complementary pairs may be biased to the same constant voltage source or to independent constant voltage sources. Briner's circuit uses PMOS devices in the stack and will suffer slower switching speeds. U.S. Pat. No. 5,963,054 to Cochran et al teaches a circuit for switching voltages greater than the gate oxide breakdown of the MOS transistors will allow. A transistor pair is disposed between the PMOS and NMOS switching transistors. U.S. Pat. No. 5,450,357 to Coffman describes a level shifting circuit for selecting different voltage levels for programming memory cells.

SUMMARY OF THE INVENTION

A principal object of the present invention is to provide a level shifting circuit, that is, a circuit that allows a digital signal to be level shifted from a low voltage supply to a high voltage supply.

A further object of the present invention is to provide a level shifting circuit that can interface ultra-deep submicron devices and high voltage devices.

A yet further object of the present invention is to provide a level shifting circuit with higher switching speed.

Another yet further object of the present invention is to provide a level shifting circuit with a reduced area.

Another yet further object of the present invention is to provide a level shifting circuit with high reliability.

Another yet further object of the present invention is to provide a level shifting circuit with no static current draw.

In accordance with the objects of this invention, a new level shifting circuit, using a zero threshold voltage device, is described. An input swings between a low supply and ground. An output swings between a high supply and ground. An inverter has an input and an output. The input is connected to the input of the level shifting circuit, and the output forms an inverted level shifting input. A first NMOS transistor has the gate connected to the level shifting input and the source connected to ground. A first zero threshold NMOS transistor has the gate connected to a low bias voltage and the source connected to the first NMOS transistor drain. A first PMOS transistor has the gate connected to the level shifting output, the source connected to the high supply, and the drain connected to the first zero threshold NMOS transistor drain. A second NMOS transistor has the gate connected to the inverted level shifting input and the source connected to ground. A second zero threshold NMOS transistor has the gate connected to the low bias voltage, the source connected to the second NMOS transistor drain, and the drain connected to the level shifting output. A second PMOS transistor has the gate connected to the first zero threshold NMOS transistor drain, the source connected to the high supply, and the drain connected to the level shifting output.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses the application of the present invention to a level shifting circuit combining low voltage and high voltage devices. It should be clear to those experienced in the art that the present invention can be applied and extended without deviating from the scope of the present invention.

Figure 1:
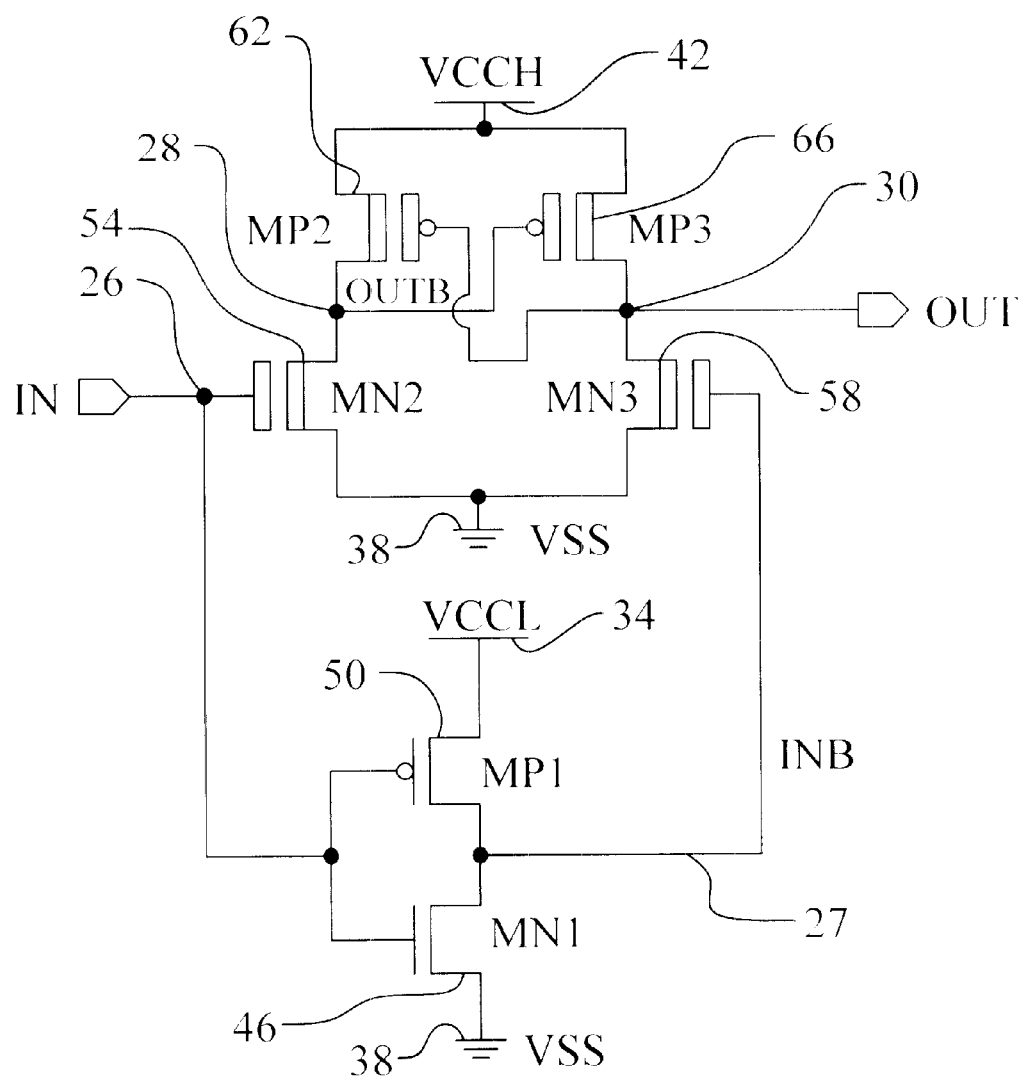
FIG. 1 illustrates a schematic of a prior art level shifting circuit.
Figure 1:
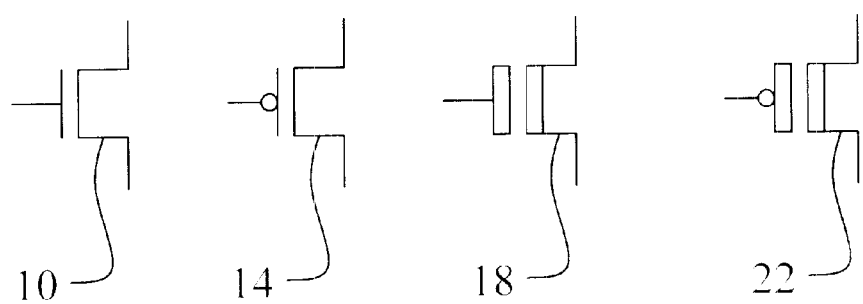
Figure 2:
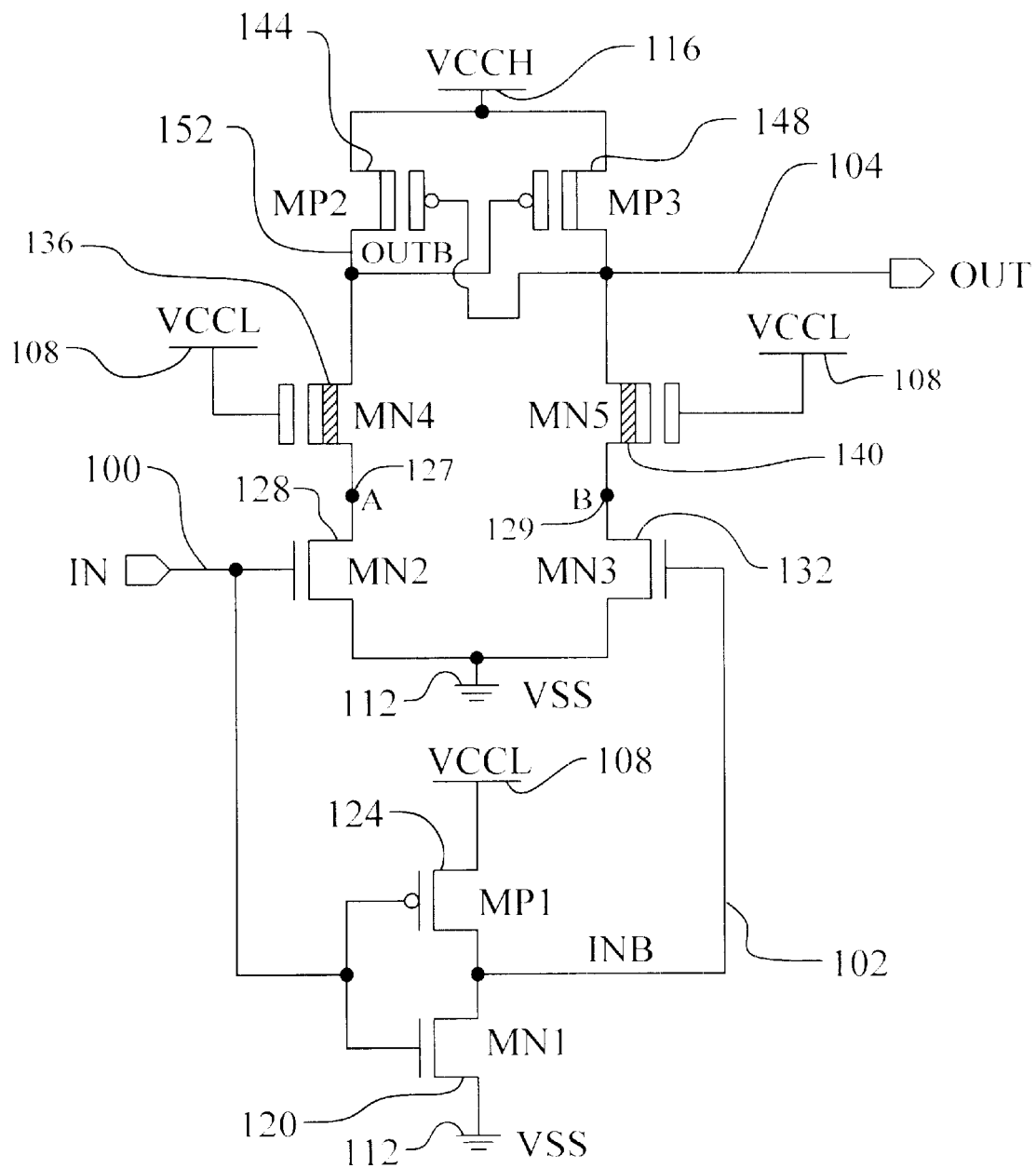
FIG. 2 illustrates a schematic of the preferred embodiment of the present invention.

Referring now particularly to FIG. 2, there is shown a schematic of the preferred embodiment of the present invention. The preferred embodiment level shifting circuit uses zero threshold voltage devices to reduce switching delay. The circuit uses five types of MOS transistors. Low voltage NMOS 80 and PMOS 84 transistors are used. High voltage NMOS 88 and PMOS 92 transistors are also used. Finally, and unique to the present invention, zero threshold voltage, high voltage NMOS transistors 96 are also used.

As in the prior art example, the low voltage transistors 80 and 84 have the thin oxide and the shallow junctions consistent with an ultra-deep submicron process. The low voltage NMOS devices 80 have voltage thresholds of between about 0.2 Volts and 0.35 Volts while the PMOS devices 84 have voltage thresholds of between about −0.2 Volts and −0.35 Volts. The low voltage transistors have operating ranges of up to about 2.5 Volts. At operating voltages above this range, avalanche or gate oxide breakdown may occur. The high voltage devices 88 and 92 have thicker oxide and deeper junctions so that these devices will withstand greater drain to source and drain to gate voltages without avalanche or gate oxide breakdown. The high voltage NMOS transistors 88 have a voltage threshold of between about 0.4 Volts and 0.7 Volts while the complementary PMOS transistors 92 have a voltage threshold of between about −0.4 Volts and −0.7 Volts. The high voltage transistors have operating ranges of up to about 10 Volts. At operating voltages above this range, avalanche or gate oxide breakdown may occur.

The zero threshold voltage, high voltage NMOS transistors 136 and 140 that are used in the circuit has two features that are advantageously used. First, the zero threshold voltage transistor has a channel region that is doped such that the threshold voltage of the transistor is about zero Volts. Therefore, the zero voltage threshold transistor 96 conducts whenever the gate-to-source voltage is zero or greater. Second, the zero voltage threshold transistors 136 and 140 have thick gate oxide and deep junctions like the high voltage NMOS 88 and high voltage PMOS 92 devices. Therefore, the zero voltage threshold transistors 136 and 140 can reliably withstand exposure to the high voltage supply, VCCH 116. The operating range for the zero voltage threshold transistors is up to about 10 Volts.

The purpose of the present invention is to increase the voltage swing of the signal IN 100 from the low supply voltage, or, simply, the low supply, which is labeled VCCL 108 to the high supply voltage, or, simply, the high supply, which is labeled VCCH 116. VCCL 108 is the voltage supply for the low voltage transistors that make up the core logic of an integrated circuit manufactured by the submicron process. The VCCL 108 supply voltage is designed to operate, for example, at between about 0.9 Volts and 2.5 Volts and even as low as about 0.5 Volts. The IN signal 100 will therefore vary between about the ground reference, VSS 112, that is typically at 0 Volts, and the VCCL supply 108 level in the two digital states of low and high, respectively.

The high supply, or VCCH 116, is biased to operate at, for example, between about 3.0 Volts and 5.0 Volts and even as high as about 10 Volts. This voltage level is used in the input/output (I/O) section of the integrated circuit and is consistent with the voltage level needed for compatibility outside the chip. The level shifted output signal, OUT 104, has a voltage swing of between VSS 112 and VCCH 116 for the digital low and high states, respectively. The level shifting circuit of the first preferred embodiment produces a level shift from the low voltage IN 100 signal to the high voltage OUT 104 signal while maintaining the logical state of the signal. A high level on IN 100 will generate a high level on OUT 104, while a low level on IN 100 will generate a low level on OUT 104.

An inverter is formed by the low voltage NMOS transistor MN1 120 and the low voltage PMOS transistor MP1 124. This inverter is powered by the VCCL supply 108. The gates of MN1 120 and MP1 124 are connected to the IN signal 100. The drains of the MN1 120 and MP1 124 are connected together and produce an inversion of the IN signal 100 that is labeled INB 102.

Low voltage NMOS transistors MN2 128 and MN3 132 and high voltage PMOS transistors MP2 144 and MP3 148 form a differential pair configuration similar to that of the prior art. However, zero voltage threshold, high voltage transistors MN4 136 and MN5 140 are added to the differential pair configuration as shown. Transistor MN2 128 has the gate connected to IN 100 and the source connected to VSS 112. Transistor MN4 136 has the gate connected to a low bias of, for example, VCCL 108, the source connected to the drain of MN2 128, and the drain connected to the OUTB node 152. Transistor MP2 144 has the gate connected to OUT 104, the source connected to VCCH 116, and the drain connected to OUTB 152. Transistor MN3 132 has the gate connected to INB 102 and the source connected to VSS 112. Transistor MN5 140 has the gate connected to a low bias voltage of, for example, VCCL 108, the source connected to the drain of MN3 132, and the drain connected to the OUT node 104. Transistor MP3 148 has the gate connected to OUTB 152, the source connected to VCCH 116, and the drain connected to OUT 104.

The presence of the zero voltage threshold, high voltage NMOS transistors MN4 136 and MN5 140 improves the performance of the level shifting circuit. Low voltage NMOS transistors MN2 128 and MN3 132 may now be used where high voltage transistors had been used in the prior art. The zero threshold voltage transistors MN4 136 and MN5 140 prevent exposure of the low voltage NMOS transistors MN2 128 and MN3 132 to the high voltage supply VCCH 116. The low bias voltage of VCCL 108 on the gates of the high voltage, zero voltage threshold NMOS transistors MN4 136 and MN5 140 insures that the drains of MN2 128 and MN3 132, or nodes A 127 and B 129, respectively, will not see a higher voltage than 1.1×VCCL. By limiting the peak drain voltage on MN2 128 and MN3 132, low voltage NMOS transistors may be used without jeopardizing reliability. The low voltage NMOS transistors MN2 128 and MN3 132, in turn, improve the switching performance of the circuit.

The first embodiment level shifting circuit exhibits dc voltage and transistor switching characteristics according to Table 2 below:

TABLE 2

| IN | INB | OUT | OUTB | MN1 | MP1 | MN2 | MN3 | MP2 | MP3 | MN4 | MN5 |
|---|---|---|---|---|---|---|---|---|---|---|---|
| VSS | VCCL | VSS | VCCH | OFF | ON | OFF | ON | ON | OFF | ON | ON |
| VCCL | VSS | VCCH | VSS | ON | OFF | ON | OFF | OFF | ON | ON | ON |

Note that the level shifting circuit exhibits no dc static current consumption. Only one transistor of the inverter pair MN1 120 and MP1 124 is ON in either state. Therefore, there exists no static current path from VCCL 108 to VSS 112. Since only the pair MN2 128 and MP3 148 or the pair MN3 132 and MP2 144 are ON at any given time, there exists no static current path between VCCH and VSS.

Note also that the high supply voltage VCCH 116 is only applied to the thick oxide devices MP2 144, MP3 148, MN4 136, and MN5 140. Therefore, reliability concerns for the thin oxide devices are eliminated.

To illustrate the ac performance of the first embodiment of the shifting circuit, consider the case of the input signal IN 100 switching from VSS to VCCL. First, the rise in gate voltage turns transistor MN2 128 ON. At this point, transistor MP2 144 also remains ON since the pre-switching bias of OUT 104 was low. Therefore, as in the prior art, the initial condition of the left side of the differential pair, after IN 100 switches states, is that MN2 128 is driving node OUTB 152 to VSS while MP2 144 is concurrently driving node OUTB 152 to VCCH 116.

The voltage change in signal IN 100 turns off transistor MP1 124 while transistor MN1 120 drives INB 102 to VSS. The loss of gate voltage causes transistor MN3 132 to turn OFF. Since the pre-switching bias on the gate of MP3 148 was VCCH, MP3 148 remains OFF. Therefore, the initial condition of the right side of the differential pair, after INB transitions low, is that both MN3 132 and MP3 148 are OFF.

As previously mentioned, the presence of the high voltage, zero voltage threshold transistors, MN4 136 and MN5 140 allows low voltage NMOS transistors MN2 128 and MN3 132 to be used. Therefore, the $I_{dsat}$ of the MN2 device is much greater than for a comparably-sized high voltage device. MN2 128 is therefore able to discharge the OUTB node 152 quickly. Once OUTB discharges sufficiently, transistor MP3 148 turns ON to pull the OUT node 104 up to VCCH to completely shut OFF MP2 144. The low voltage NMOS transistor MN2 thereby allows a shorter switching time.

The case where IN 100 switches from VCCL to VSS works in similar fashion where the high $I_{dsat}$ of the low voltage transistor MN3 132 more rapidly discharges the OUT node 104 and thereby reduces the switching time.

The analysis of the ac operation of the preferred embodiment level shifting circuit demonstrates how the design may be used in an ultra-deep submicron process to reduce switching delay. By adding the high voltage, zero threshold voltage transistors, MN4 136 and MN5 140, low voltage NMOS input devices, MN2 128 and MN3 132, may be used. The improved $I_{dsat}$ of the low voltage devices allows the circuit to switch faster.

In addition, for a given switching speed requirement, MN2 128 and MN3 132 may be made substantially smaller than would be necessary in the prior art design. Even with the additional transistors, MN4 136 and MN5 140, the layout area required for the level shifting circuit is reduced.

As shown in the preferred embodiments, the present invention provides an effective method for increasing the switching speed of the level shifting circuit through the use of high voltage, zero threshold voltage NMOS transistors. In addition, for a given speed requirement, the area of the level shifting circuit can be reduced because low voltage NMOS input transistors can be used.

While the invention has been particularly shown and described with reference to the preferred embodiments thereof, it will be understood by those skilled in the art that various changes in form and details may be made without departing from the spirit and scope of the invention.

What is claimed is:

1. A level shifting circuit comprising:
    a circuit input swinging between a low supply and ground;
    a circuit output swinging between a high supply and said ground;
    an inverter with input connected to said circuit input and with output forming an inverted circuit input;
    a first NMOS transistor with gate connected to said circuit input and with source connected to said ground;
    a first zero threshold NMOS transistor with gate connected to a low bias voltage and with source connected to said first NMOS transistor drain;
    a first PMOS transistor with gate connected to said circuit output, with source connected to said high supply, and with drain connected to said first zero threshold NMOS transistor drain wherein said first PMOS transistor is a high voltage transistor;
    a second NMOS transistor with gate connected to said inverted circuit input and with source connected to said ground;
    a second zero threshold NMOS transistor with gate connected to said low bias voltage, with source connected to said second NMOS transistor drain, and with drain connected to said circuit output; and
    a second PMOS transistor with gate connected said first zero threshold NMOS transistor drain, with source connected to said high supply, and with drain connected to said circuit output wherein said first PMOS transistor is a high voltage transistor.

2. The circuit according to claim 1 wherein said inverter comprises an NMOS transistor and a PMOS transistor.

3. The circuit according to claim 2 wherein said NMOS transistor and said PMOS transistor comprise low voltage transistors.

4. The circuit according to claim 1 wherein said first PMOS transistor and said second PMOS transistor comprise high voltage transistors.

5. The circuit according to claim 1 wherein said first NMOS transistor and said second NMOS transistor comprise low voltage transistors.

6. The circuit according to claim 1 wherein said first zero threshold NMOS transistor and said second zero threshold transistor comprise high voltage transistors.

7. The circuit according to claim 1 wherein said low supply is between about 0.5 Volts and 2.5 Volts.

8. The circuit according to claim 1 wherein said high supply is between about 3.0 Volts and 10 Volts.

9. The circuit according to claim 1 wherein said low bias voltage comprises said low supply.

10. A level shifting circuit comprising:
    a circuit input swinging between a low supply and ground;
    a circuit output swinging between a high supply and said ground;
    an inverter with input connected to said circuit input and output forming an inverted circuit input;
    a first NMOS transistor with gate connected to said circuit input, with source connected to said ground, and wherein said transistor comprises a low voltage transistor;
    a first zero threshold NMOS transistor with gate connected to a low bias voltage, with source connected to said first NMOS transistor drain and wherein said transistor comprises a high voltage transistor having a thick gate oxide;
    a first PMOS transistor with gate connected to said circuit output, with source connected to said high supply, with drain connected to said first zero threshold NMOS transistor drain, and wherein said transistor comprises a high voltage transistor;
    a second NMOS transistor with gate connected to said inverted circuit input, with source connected to said ground, and wherein said transistor comprises a low voltage transistor;
    a second zero threshold NMOS transistor with gate connected to said low bias voltage, with source connected to said second NMOS transistor drain, with drain connected to said circuit output, and wherein said transistor comprises a high voltage transistor having a thick gate oxide; and
    a second PMOS transistor with gate connected to said first zero threshold NMOS transistor drain, with source connected to said high supply, with drain connected to said circuit output, and wherein said transistor comprises a high voltage transistor.

11. The circuit according to claim 10 wherein said inverter comprises an NMOS transistor and a PMOS transistor.

12. The circuit according to claim 11 wherein said NMOS transistor and said PMOS transistor comprise low voltage transistors.

13. The circuit according to claim 10 wherein said low supply is between about 0.5 Volts and 2.5 Volts.

14. The circuit according to claim 10 wherein said high supply is between about 3.0 Volts and 10 Volts.

15. The circuit according to claim 10 wherein said low bias voltage comprises said low supply.

16. A level shifting circuit comprising:
a circuit input swinging between a low supply and ground;
a circuit output swinging between a high supply and said ground;
an inverter with input connected to said circuit input and output forming an inverted circuit input;
a first NMOS transistor with gate connected to said circuit input, with source connected to said ground, and wherein said transistor comprises a low voltage transistor;
a first zero threshold NMOS transistor with gate connected to said low supply, with source connected to said first NMOS transistor drain, and wherein said transistor comprises a high voltage transistor having a thick gate oxide;
a first PMOS transistor with gate connected to said circuit output, with source connected to said high supply, with drain connected to said first zero threshold NMOS transistor drain, and wherein said transistor comprises a high voltage transistor;
a second NMOS transistor with gate connected to said inverted circuit input, with source connected to said ground, and wherein said transistor comprises a low voltage transistor;
a second zero threshold NMOS transistor with gate connected to said low supply, with source connected to said second NMOS transistor drain, with drain connected to said circuit output, and wherein said transistor comprises a high voltage transistor having a thick gate oxide; and
a second PMOS transistor with gate connected to said first zero threshold NMOS transistor drain, with source connected to said high supply, with drain connected to said circuit output, and wherein said transistor comprises a high voltage transistor.

17. The circuit according to claim 16 wherein said inverter comprises an NMOS transistor and a PMOS transistor.

18. The circuit according to claim 17 wherein said NMOS transistor and said PMOS transistor comprise low voltage transistors.

19. The circuit according to claim 16 wherein said low supply is between about 0.5 Volts and 2.5 Volts.

20. The circuit according to claim 16 wherein said high supply is between about 3.0 Volts and 10 Volts.

* * * * *